(12) United States Patent
Gaben

(10) Patent No.: US 10,998,236 B2
(45) Date of Patent: May 4, 2021

(54) METHOD FOR FABRICATING A ROW OF MOS TRANSISTORS

(71) Applicant: STMicroelectronics (Crolles 2) SAS, Crolles (FR)

(72) Inventor: Loic Gaben, Busque (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/582,576

(22) Filed: Sep. 25, 2019

(65) Prior Publication Data

US 2020/0020589 A1 Jan. 16, 2020

Related U.S. Application Data

(63) Continuation of application No. 15/942,540, filed on Apr. 1, 2018, now Pat. No. 10,468,306.

(30) Foreign Application Priority Data

Apr. 3, 2017 (FR) .................................. 1752859

(51) Int. Cl.
*H01L 21/8234* (2006.01)
*H01L 21/02* (2006.01)
(Continued)

(52) U.S. Cl.
CPC ...... *H01L 21/823437* (2013.01); *B82Y 10/00* (2013.01); *H01L 21/02293* (2013.01); *H01L 21/4885* (2013.01); *H01L 21/823425* (2013.01); *H01L 21/823431* (2013.01); *H01L 23/52* (2013.01); *H01L 27/088* (2013.01); *H01L 27/0886* (2013.01); *H01L 27/0924* (2013.01); *H01L 29/0673* (2013.01); *H01L 29/42392* (2013.01); *H01L 29/66439* (2013.01); *H01L 29/66795* (2013.01); *H01L 29/775* (2013.01); *H01L 29/78696* (2013.01); (Continued)

(58) Field of Classification Search
CPC .............................................. H01L 21/823431
See application file for complete search history.

(56) References Cited

U.S. PATENT DOCUMENTS 9,362,181 B1 6/2016 Xie et al.
2014/0035045 A1 2/2014 Alptekin et al.
(Continued)

FOREIGN PATENT DOCUMENTS

WO 2016137589 A1 9/2016

OTHER PUBLICATIONS

INPI Search Report and Written Opinion for FR 1752859 dated Dec. 6, 2017 (7 pages).

*Primary Examiner* — Yu-Hsi D Sun
(74) *Attorney, Agent, or Firm* — Crowe & Dunlevy (57) ABSTRACT

A strip made of a semiconductor material is formed over a substrate. Longitudinal portions of the strip having a same length are covered with sacrificial gates made of an insulating material and spaced apart from each other. Non-covered portions of the strip are doped to form source/drain regions. An insulating layer followed by a layer of a temporary material is then deposited. Certain ones of the sacrificial gates are left in place. Certain other ones of the sacrificial gates are replaced by a metal gate structure. The temporary material is then replaced with a conductive material to form contacts to the source/drain regions.

23 Claims, 12 Drawing Sheets (51) Int. Cl.
*H01L 23/52* (2006.01)
*H01L 27/088* (2006.01)
*H01L 21/48* (2006.01)
*H01L 29/06* (2006.01)
*H01L 29/66* (2006.01)
*B82Y 10/00* (2011.01)
*H01L 29/423* (2006.01)
*H01L 29/786* (2006.01)
*H01L 27/092* (2006.01)
*H01L 29/775* (2006.01)
*B82Y 40/00* (2011.01)
*H01L 21/311* (2006.01)

(52) U.S. Cl.
CPC ............. *B82Y 40/00* (2013.01); *H01L 21/311* (2013.01); *H01L 29/66545* (2013.01); *H01L 2924/14* (2013.01)

(56) References Cited

U.S. PATENT DOCUMENTS

| | | |
|---|---|---|
| 2014/0054713 A1 | 2/2014 | Lee et al. |
| 2015/0255608 A1 | 9/2015 | Cai et al. |
| 2016/0071848 A1 | 3/2016 | Sengupta et al. |
| 2016/0181367 A1* | 6/2016 | Ahmed ............... H01L 29/1045 257/288 |
| 2016/0380052 A1* | 12/2016 | Kim .................... H01L 29/0653 257/401 |
| 2018/0061955 A1 | 3/2018 | Gaben |

\* cited by examiner

METHOD FOR FABRICATING A ROW OF MOS TRANSISTORS

CROSS REFERENCE TO RELATED APPLICATIONS

This application is a continuation of U.S. patent application Ser. No. 15/942,540 filed Apr. 1, 2018, which claims the priority benefit of French Application for Patent No. 1752859, filed on Apr. 3, 2017, the disclosures of which are hereby incorporated by reference in their entireties.

TECHNICAL FIELD

The present application relates to a method for fabricating surrounding gate transistors and more particularly a method for fabricating a row of surrounding gate transistors.

BACKGROUND

A surrounding gate (or gate all around) MOS transistor is a MOS transistor whose channel region is surrounded by a gate isolation layer then by a conducting layer. The channel region of a transistor of this type is therefore fully used.

Various methods are known for fabricating surrounding gate MOS transistors of various types. These methods generally require a large number of steps for the fabrication of the transistors and of the insulating regions between transistors or groups of transistors.

There is a need in the art for a method of fabricating a row of surrounding gate MOS transistors with a minimized number of fabrication steps.

SUMMARY

Thus, one embodiment provides a method for fabricating MOS transistors disposed in a row comprising the following successive steps: a) forming at least one strip made of a semiconductor material on top of a substrate and parallel to the latter; b) covering longitudinal portions of the same length of the strip with sacrificial gates made of an insulating material, these gates being spaced out; c) doping the non-covered portions of the strip; d) depositing an insulating layer then a layer of a temporary material onto the structure obtained; e) leaving in place certain sacrificial gates and form in place of the others the gates of the transistors by successively depositing a gate insulator and a gate conductor; and f) replacing the temporary material with a conductive material forming the drain and source electrodes of the transistors.

According to one embodiment, the sacrificial gates have different heights.

According to one embodiment, the sacrificial gates of different heights are formed by successive lithography steps.

According to one embodiment, the sacrificial gates of different heights are formed by photolithography using different doses of exposure to a beam.

According to one embodiment, the step c) comprises the following successive steps: removing the portions not surrounded from the strip; and growing by epitaxy, starting from the portions, protuberances made of a doped semiconductor material.

According to one embodiment, the method furthermore comprises, between the steps b) and c), a step g) forming of spacers protecting the lateral faces of the sacrificial gates.

According to one embodiment, the sacrificial gates left in place are protected by masks.

According to one embodiment, the sacrificial gates have a width in the range between 2 and 50 nm and are spaced out by a pitch of less than 100 nm.

According to one embodiment, the substrate is made of bulk silicon.

According to one embodiment, the substrate is a layer of silicon on oxide.

According to one embodiment, the strip is a fin.

According to one embodiment, the strip comprises at least one suspended wire.

According to one embodiment, the sacrificial gates are formed from hydrogen silsesquioxane.

According to one embodiment, the gate insulator is made of hafnium oxide, and the gate conductor and the conductive material are made of tungsten.

Another embodiment provides MOS transistors disposed in a row whose gates are formed by portions covered by a gate insulator material and by a metal of a strip made of a semiconductor material and whose drains and sources are formed by doped portions of the common strip, layers of insulating material covering non-doped portions of the common strip electrically isolating transistors or groups of transistors in series from one another.

In an embodiment, an integrated circuit comprises: a substrate; a strip made of a semiconductor material extending over the substrate, wherein said strip includes first portions that are spaced apart from each other and second portions that are doped to form source and drain regions; wherein each second portion is positioned between two first portions; wherein first ones of the first portions are covered by a gate structure comprising a gate insulator material and a metal material forming a transistor gate; wherein second ones of the first portions are covered by an insulating material defining a sacrificial gate; wherein each sacrificial gate is positioned between two gate structures.

In another embodiment, an integrated circuit comprises: a strip made of a semiconductor material extending on top of and parallel to a substrate, the strip including first longitudinal portions having a same first length, second longitudinal portions having a same second length, and third longitudinal portions having a same third length; sacrificial gates made of an insulating material and covering the first longitudinal portions, wherein the sacrificial gates are spaced apart from each other; wherein the second longitudinal portions are doped to form source and drain regions, and one third longitudinal portion is located between two second longitudinal portions of a pair of second longitudinal portions to form a channel region, and one first longitudinal portion is located between pairs of second longitudinal portions; and a transistor gate made of a gate insulator and a gate conductor and covering the third longitudinal portion.

BRIEF DESCRIPTION OF THE DRAWINGS

These features and advantages, together with others, will be presented in detail in the following description of particular embodiments by way of non-limiting examples in relation with the appended Figures amongst which.

DETAILED DESCRIPTION

The same elements have been denoted by the same references in the various Figures. For the sake of clarity, only the elements useful to the understanding of the embodiments described have been shown and are detailed.

In the description that follows, when reference is made to positional qualifiers, such as the terms "top", "on top of", "lower", "upper", etc., or to orientational qualifiers, such as the terms "horizontal", "vertical", etc., reference is made to the orientation of the elements in the Figures. Unless otherwise specified, the expression "around" means to the nearest 10%, preferably to the nearest 5%.

Figure 1A:
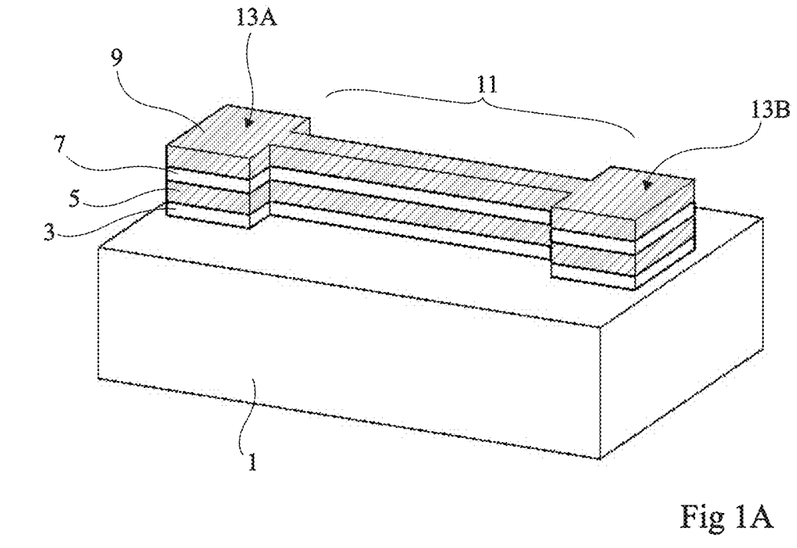
FIGS. 1A to 1N illustrate successive steps of one embodiment of a method for fabricating a row of surrounding gate transistors.
Figure 1B:
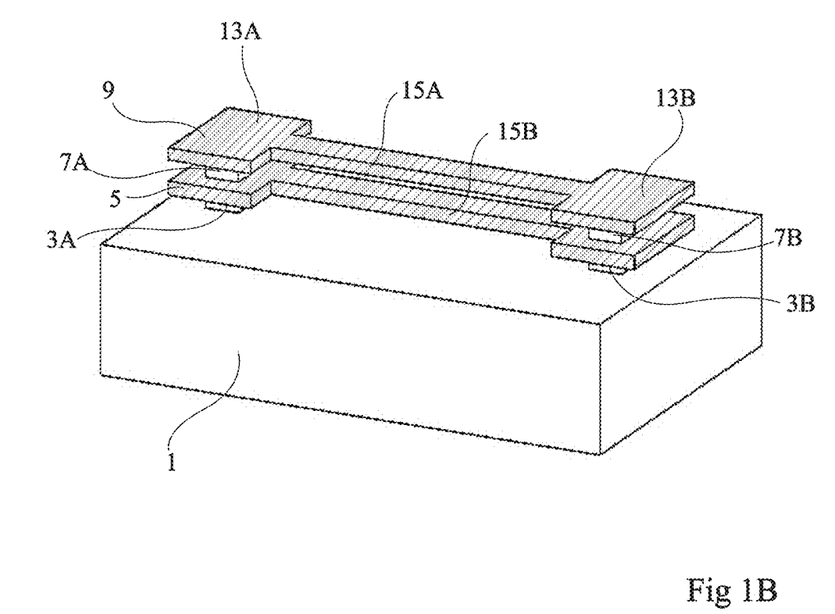
Figure 1C:
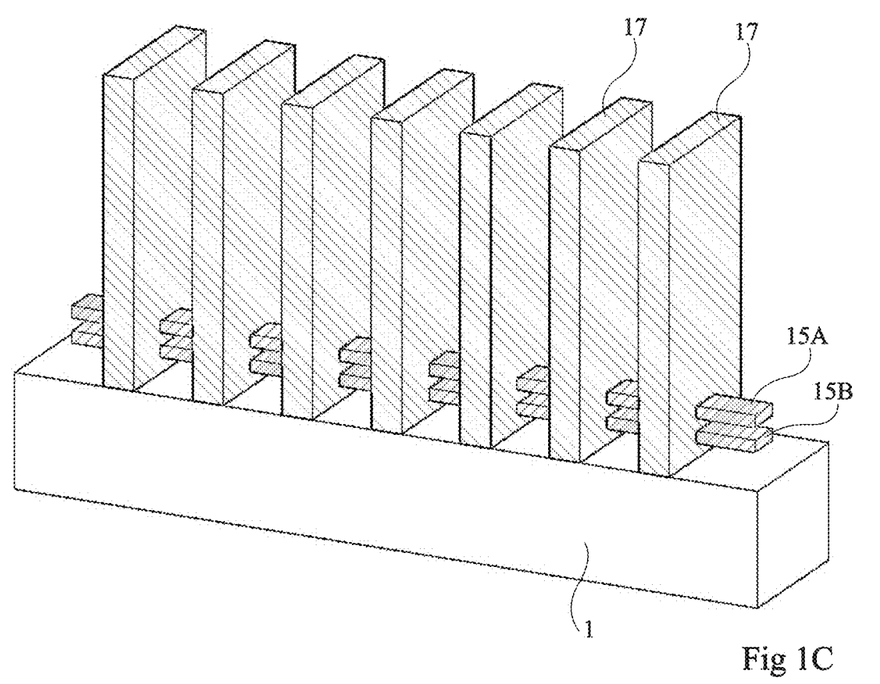
Figure 1D:
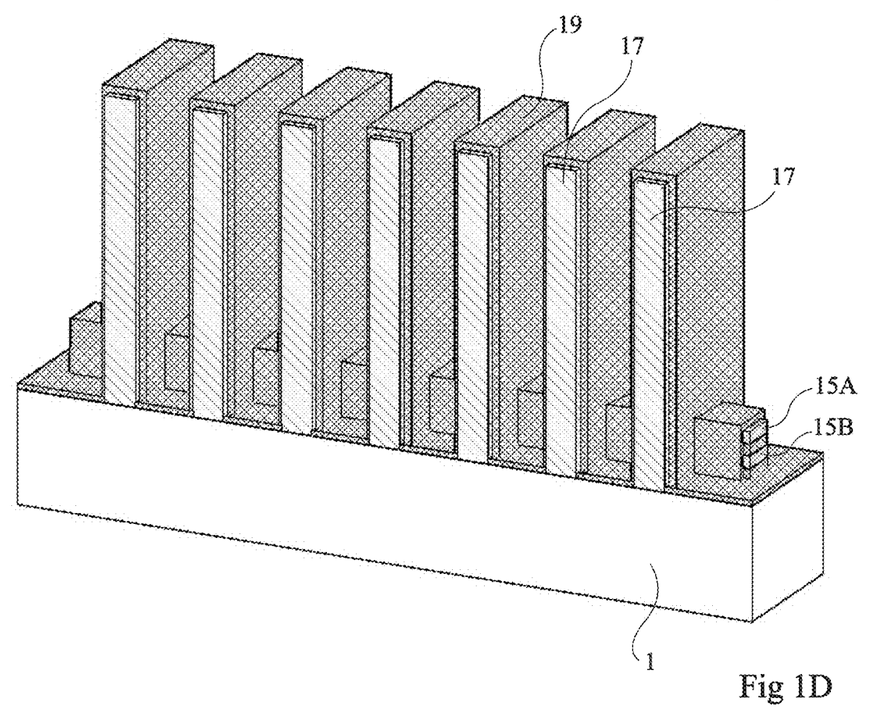
Figure 1E:
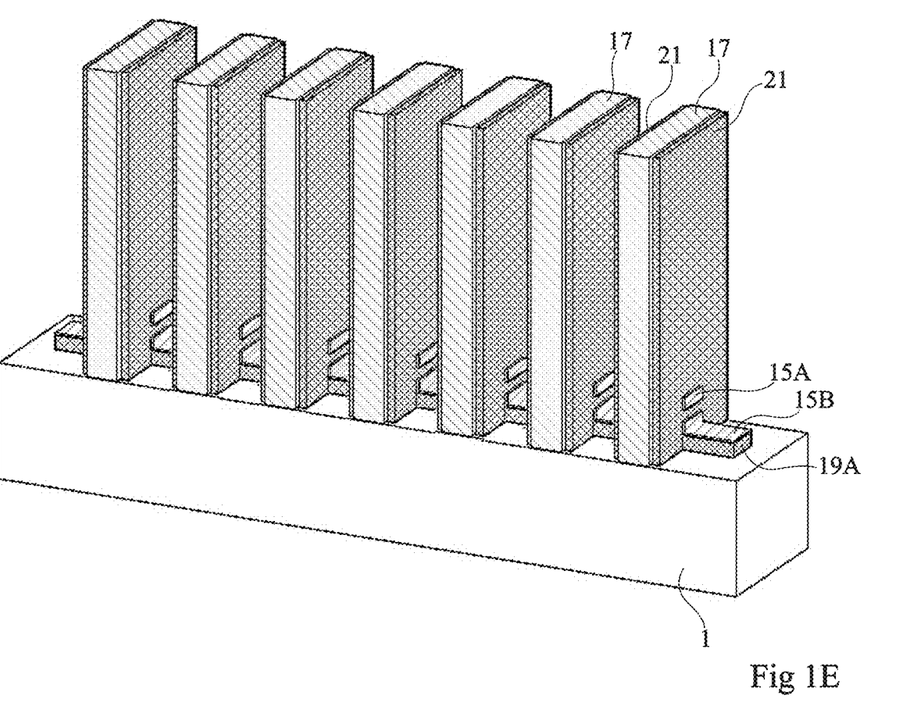
Figure 1F:
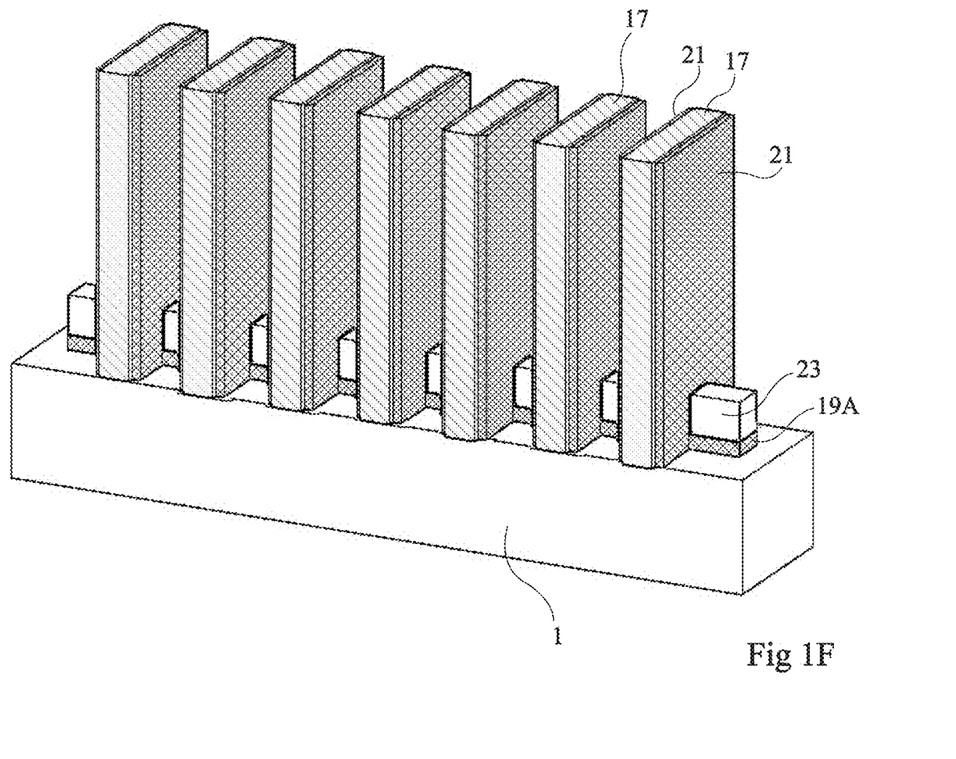
Figure 1G:
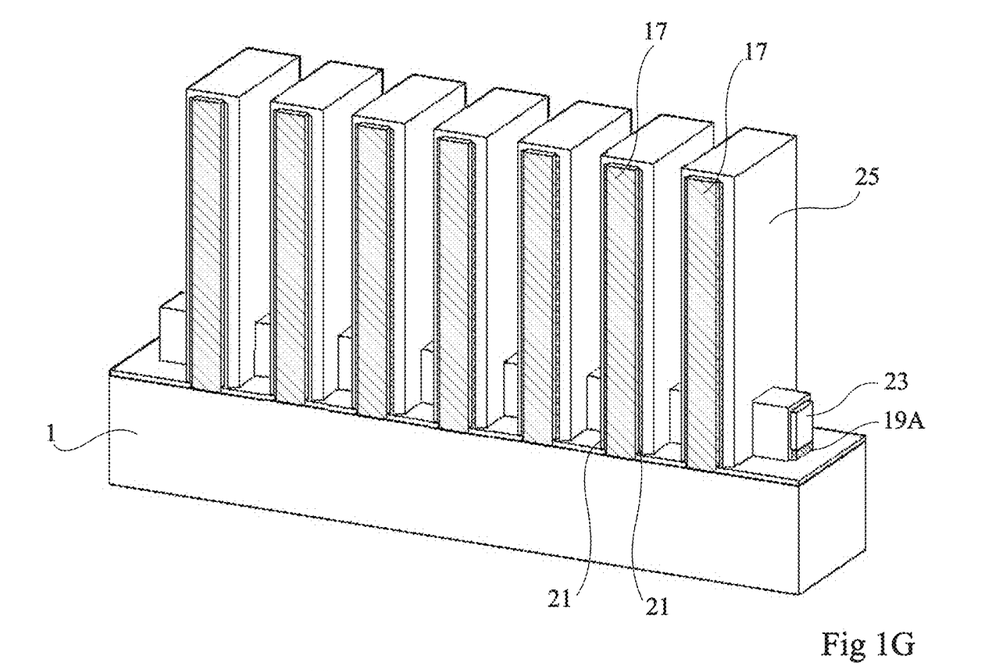
Figure 1H:
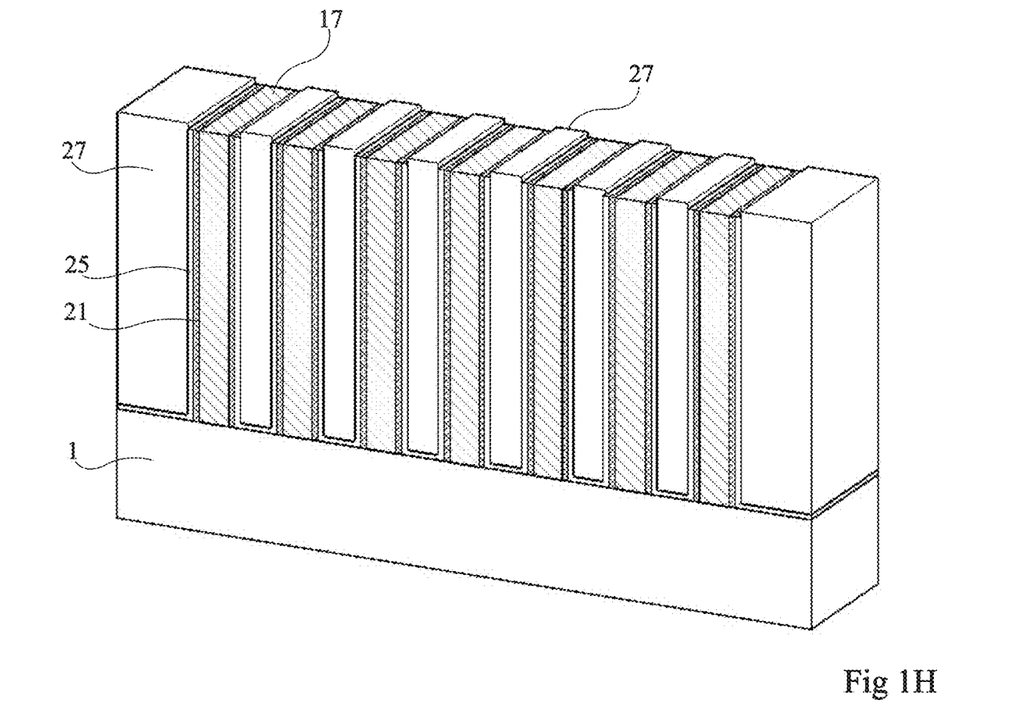
Figure 1I:
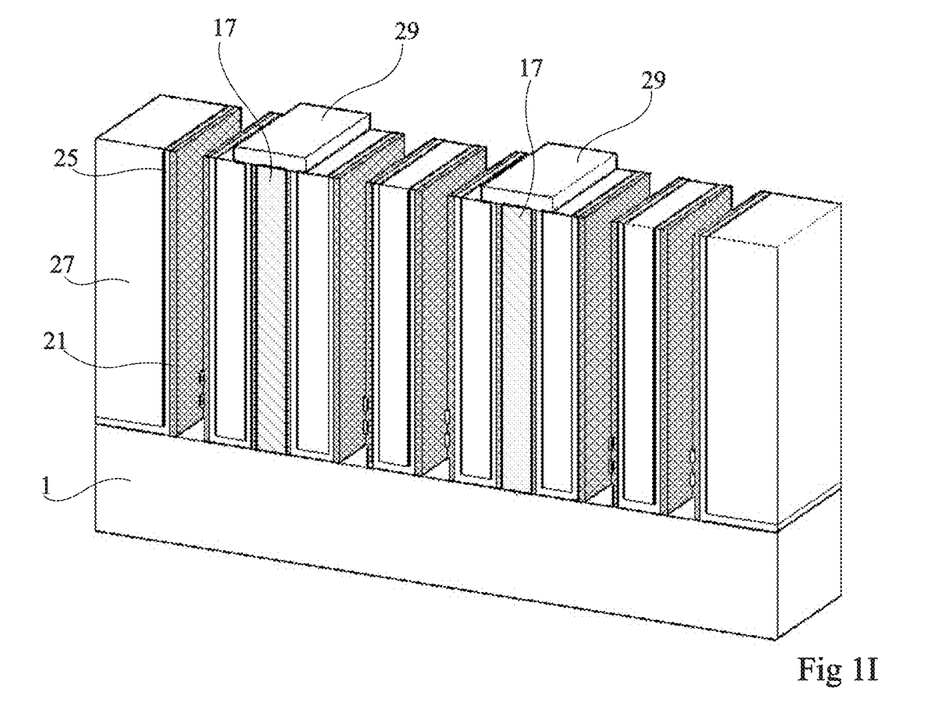
Figure 1J:
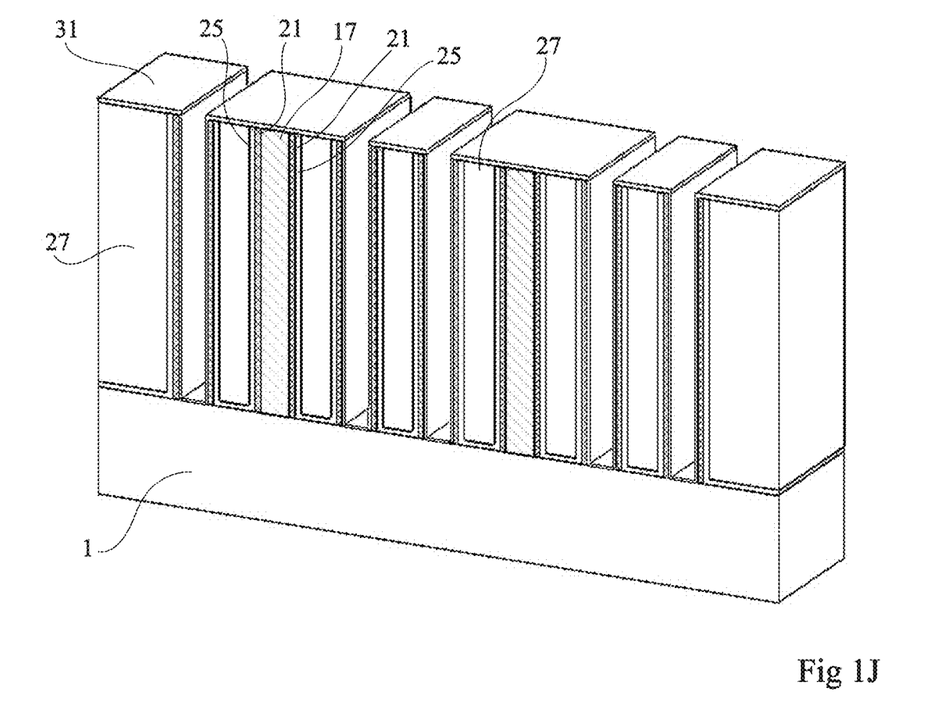
Figure 1K:
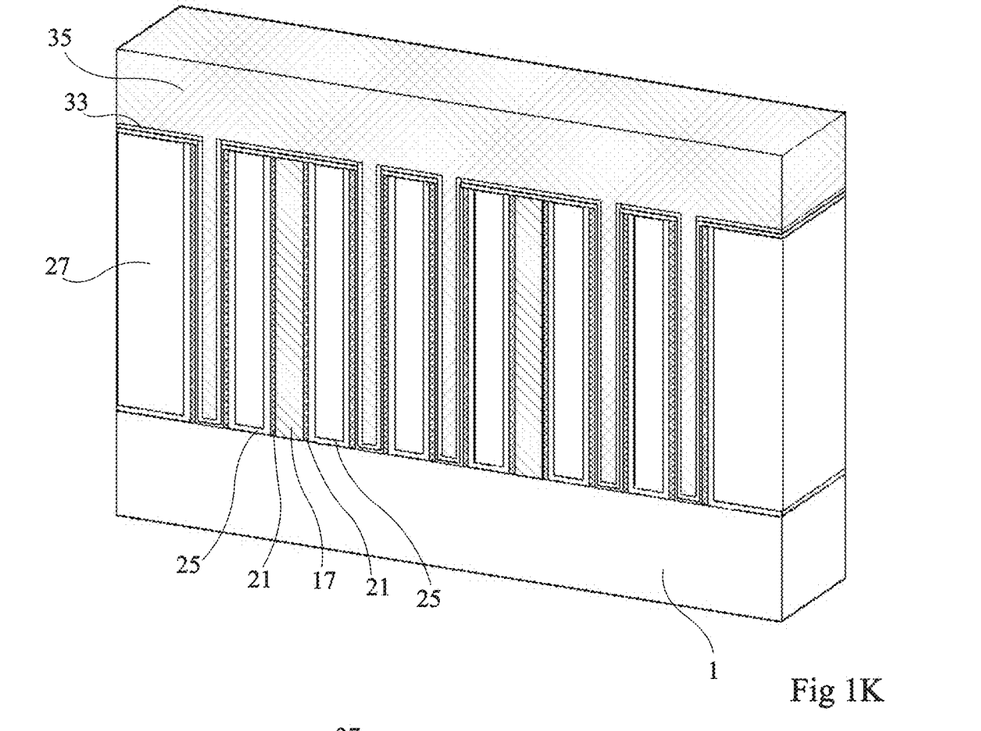
Figure 1L:
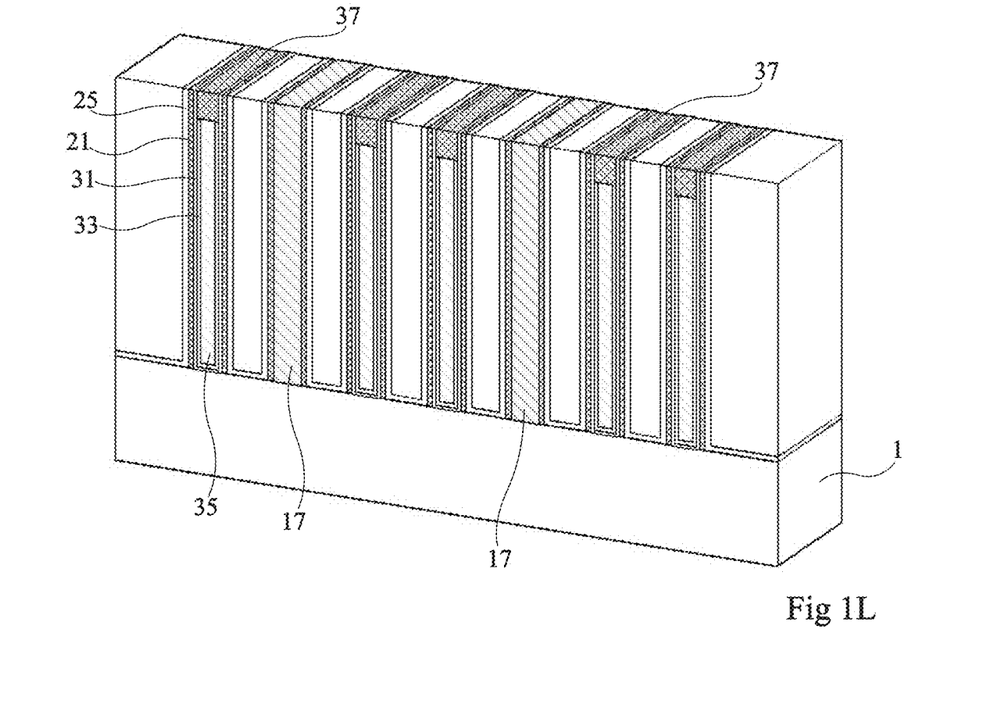
Figure 1M:
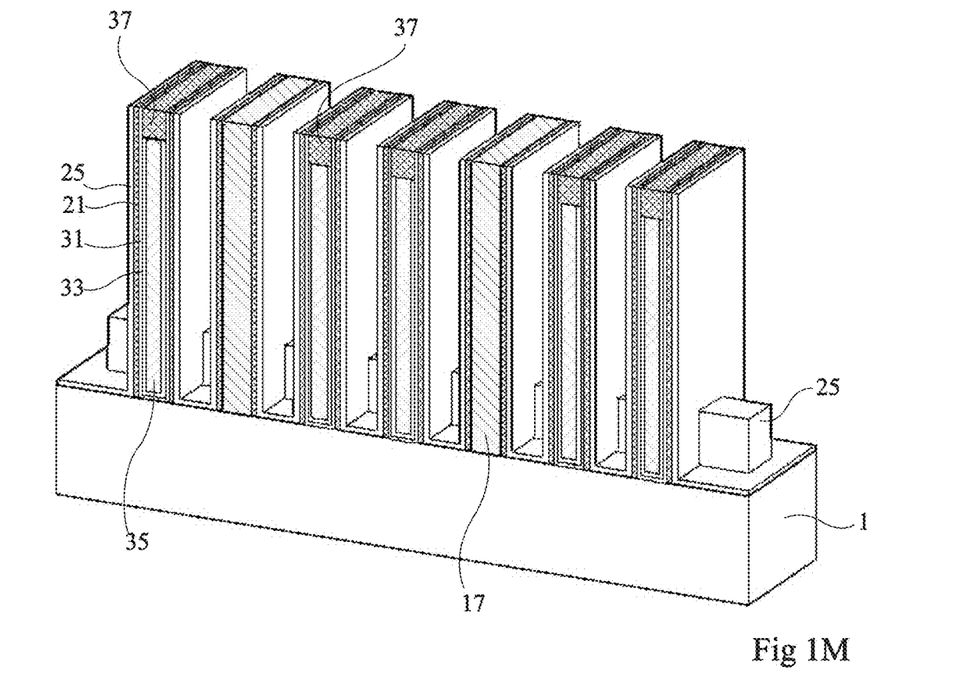
Figure 1N:
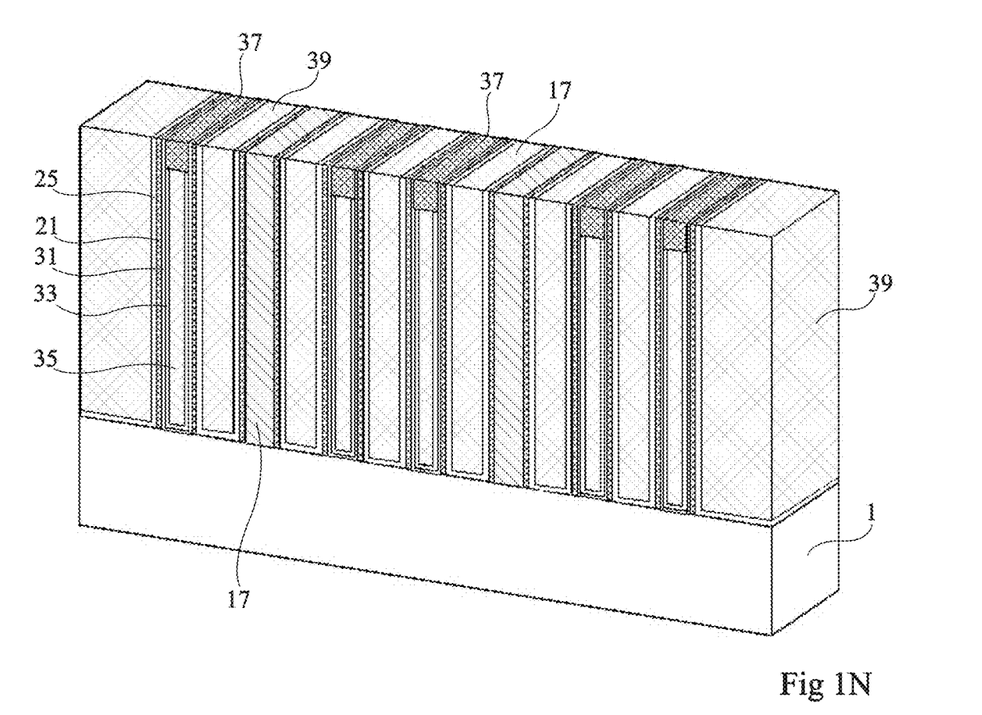

FIGS. 1A to 1N illustrate the steps of one embodiment of a method for fabricating a row of surrounding gate MOS transistors. This method will be described in the case of the fabrication of MOS transistors with N channel but may also be applied to the fabrication of MOS transistors with P channel.

At the step in FIG. 1A, successive single-crystal layers 3, 5, 7 and 9 have been deposited onto a semiconductor substrate 1. The substrate 1 is, for example, made of silicon. The layers 3 and 7 are made of the same material and the layers 5 and 9 are also made of the same material but different from that of the layers 3 and 7. The material of the layers 3 and 7 is selectively etchable with respect to that of the layers 5 and 9. The layers 3 and 7 are, for example, made of silicon-germanium comprising, for example, 70% of silicon and 30% of germanium. The layers 5 and 9 are, for example, made of intrinsic silicon or lightly-doped silicon of the P type. By way of a variant, the layers 5 and 9 could be lightly doped of the N type. The layers 3 and 7 are, for example, of the same thickness, for example in the range between 5 and 10 nm. The layers 5 and 9 are of the same thickness, for example in the range between 5 and 20 nm, for example between 3 and 7 nm. By way of a variant, the layers 3 and 7 could be made of silicon and the layers 5 and 9 could be made of lightly-doped silicon-germanium.

The layers 3, 5, 7 and 9 are etched in such a manner as to form, as seen from above, a strip 11 connected at each of its ends to contact pads 13A and 13B, for example of rectangular or square shape. The contact pads 13A and 13B are wider than the strip 11. The strip 11 has, for example, a width in the range for example between 5 and 50 nm, around 25 nm, and a length in the range, for example, between 50 and 500 nm, around 300 nm.

At the step in FIG. 1B, the layers 3 and 7 are selectively etched with respect to the layers 5 and 9. The layers 5 and 9 thus form suspended nano-wires or nano-ribbons 15A and 15B, denoted by the wires 15A and 15B in the following part of the description. The layers 3 and 7 are etched, for example, by wet etching. The dimensions of the contact pads 13A and 13B are designed so that portions 3A, 3B, 7A and 7B of the layers 3 and 7 remain in the center of these contact pads after etching. The portions 3A, 3B, 7A and 7B form a support for the wires 15A and 15B. The contact pads 13A and 13B have, for example, sides of dimensions in the range between 100 and 200 nm, around 150 nm.

One advantage of this method is to allow the creation of nano-wires exhibiting a high mechanical resistance and whose length can go up to 1 µm. In addition, it is possible to create chains of nano-wires by forming several structures, such as the structure shown in FIG. 1A, connected one to the next via a common contact pad.

It is clear for those skilled in the art that it is possible with this method to produce a single or more than two semiconductor wires suspended one above the other.

For reasons of simplification of the Figures, the contact pads 13A and 13B are not shown in FIGS. 1C to 1N.

At the step in FIG. 1C, portions of the wires 15A and 15B, which are intended to become channel regions, have been surrounded by insulating sacrificial gates 17. The sacrificial gates 17 are vertical plates made of an electrically insulating material, for example silicon oxide. The sacrificial gates 17 cover portions of the same length of the wires 15A and 15B and are spaced out with a constant pitch p. The pitch p is, for example, less than 100 nm. The sacrificial gates have a width, for example, in the range between 2 and 50 nm, around 10 nm, and a height in the range between 100 and 250 nm, around 200 nm.

In order to form the sacrificial gates 17, a layer of a resist being photosensitive and/or sensitive to a beam of electrons is deposited on the structure in FIG. 1B. A resist is chosen which, once irradiated, is transformed into an insulating material, such as, for example, hydrogen silsesquioxane (HSQ) which is transformed into silicon oxide once irradiated. The resist is irradiated, for example, by a beam of electrons or by an ultraviolet beam depending on the desired pattern, along lines perpendicular to the rows of transistors in the process of being fabricated. The untransformed resist is subsequently eliminated by selective etching so as to only leave the patterns visible.

At the step in FIG. 1D, an insulating layer 19 is deposited in a conformal manner onto the structure. The layer 19 is deposited onto the horizontal and vertical walls of the sacrificial gates 17, surrounds the visible portions of the wires 15A and 15B and fills the spaces between these wires. The layer 19 is, for example, made of silicon nitride. The layer 19 has a thickness in the range, for example, between 1 and 20 nm, around 5 nm. The vertical parts of the layer 19 coating the vertical walls of the sacrificial gates 17 form spacers 21.

At the step in FIG. 1E, the following are successively etched by selective methods of vertical anisotropic etching:
the portions of the layer 19 resting on the upper wall of the sacrificial gates 17 and on the accessible upper face of the wire 15A;
the open portions of the wire 15A; and
the portions of the layer 19 present on the accessible upper face of the wire 15B, an upper portion of the wires 15B potentially being etched during these steps.

For a higher number of suspended wires, these operations will need to be repeated until only one visible wire remains (i.e., the bottom-most wire). In the case where only a single suspended wire is used, this wire may be partially etched.

At the step in FIG. 1F, doped semiconductor protuberances 23 are grown by selective epitaxy. The protuberances 23 grow starting from the upper accessible faces of the wires 15B and of the accessible lateral faces of the portions of the wires 15A, and extend between opposing spacers 21. The protuberances 23 are doped of the N type, in the case of a transistor with N channel, and are, for example, made of silicon doped with phosphorus. In the case of a transistor with P channel, the protuberances 23 are doped of the P type and are, for example, made of silicon-germanium doped with boron. The protuberances 23 will form the drain and source regions of the transistors in the process of fabrication.

At the step in FIG. 1G, an etch stop layer 25 is deposited in a conformal manner onto the structure. The layer 25 is, for example, made of silicon nitride and has a thickness in the range between 1 and 20 nm, around 5 nm.

At the step in FIG. 1H, the structure is totally covered by a layer 27 of a temporary material, for example made of polysilicon, which fills the voids existing in the structure. The structure is subsequently planarized, for example by a chemical-mechanical polishing (CMP) method, down to the etch stop layer 25. Portions of the etch stop layer 25 positioned on the top end of the sacrificial gates are etched and the upper parts of the sacrificial gates are rendered accessible.

At the step in FIG. 1I, certain sacrificial gates 17 are removed and others are left in place. The sacrificial gates 17 left in place will allow transistors or groups of transistors in the same row to be electrically isolated from one another. The sacrificial gates 17 to be left in place have been covered by protective masks 29. The material of the sacrificial gates 17 may be selectively etched with respect to the material forming the masks 29. The masks 29 thus prevent an undesired etch of the sacrificial gates that they cover. The masks 29 are, for example, made of silicon nitride. The sacrificial gates 17 are, for example, removed by wet etching, using hydrofluoric acid. Once the operation for etching the sacrificial gates has ended, the masks 29 are removed by selective etching. By way of a variant, the masks 29 may remain in place.

By way of a variant, lower portions of the material of the sacrificial gates could be left under the lower wires of the transistors in the process of formation in order to isolate the future gate conductor from the substrate.

At the step in FIG. 1J, a conformal deposition is carried out over the whole structure of a layer 31 of a gate insulator. The layer 31 surrounds the portions of the wires 15A and 15B and covers the horizontal and vertical walls of the structure. The gate insulator 31 is preferably a high-permittivity material, for example hafnium oxide with a permittivity in the range between 25 and 40. The gate insulator layer 31 has, for example, a thickness of less than 3 nm.

At the step in FIG. 1K, a conducting layer 35 is deposited on the structure in a conformal manner so as to fill the voids existing in the structure. Conventionally, the deposition of the conducting layer 35 is preceded by the deposition of an adhesion layer 33. The conducting layer completely fills the space left by the sacrificial gates 17. The conducting layer 35 is, for example, a metal layer, for example made of tungsten. The layer 35 forms the gate conductors of the transistors in the process of fabrication. The adhesion layer 33 is, for example, made of titanium nitride.

At the step in FIG. 1L, the portions of the gate insulator layer 31, of the adhesion layer 33 and of the conducting layer 35 resting on the upper face of the structure in FIG. 1I are etched, for example by CMP. Thus, the top ends of the sacrificial gates 17 left in place in FIG. 1I are opened up.

In addition, at the step in FIG. 1L, cavities are formed in the upper part of the gates of the transistors in the process of fabrication and they are filled with insulating plugs 37. In order to form these cavities, the adhesion layer 33 and the conducting layer 35 are partially etched. The cavities have, for example, a depth in the range between 10 and 50 nm, around 20 nm. The plugs 37, made of an insulating material, for example silicon nitride, are subsequently formed within the cavities.

At the step in FIG. 1M, the temporary material 27 is removed. For this purpose, a selective wet etch is, for example, carried out. In the case where the temporary material is polysilicon, a wet etch with tetramethylammonium hydroxide (TMAH) may be used.

At the step in FIG. 1N, the source and drain contacts of the transistors are formed in the process of fabrication. For this purpose, the following operations are carried out successively:

etch the portions of the etch stop layer 25 covering the protuberances 23;

carry out a silicidation of the structure obtained, for example with a silicide of nickel/platinum or a silicide of titanium;

cover the structure with a conductive material 39, for example a metal, for example tungsten; and planarize the upper surface of the structure, for example by carrying out a chemical-mechanical polishing, in order to disconnect the terminals of the transistors.

One advantage of the method described in relation with FIGS. 1A to 1N is that it optimizes the number of fabrication steps by using sacrificial gates for the isolation of the transistors or groups of transistors from one another instead of creating specific new insulating strips.

According to one variant, it is still possible, at the end of the method, to remove the portions of nano-wires remaining in the sacrificial gates, for example by etching them after having removed the sacrificial gates.

According to another variant, it is possible to form, in place of certain sacrificial gates, new MOS transistor gate regions, for example by using gate insulator and gate conductor materials different from the aforementioned ones. Different materials will allow, for example, different threshold voltages or a lower power consumption to be obtained.

Figure 2:
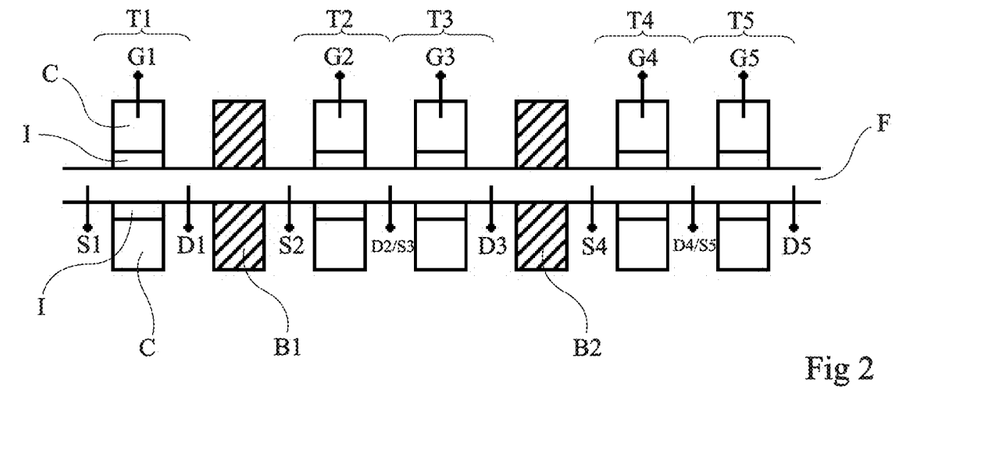
FIG. 2 illustrates one embodiment of a row of surrounding gate transistors.

FIG. 2 illustrates, in a very schematic form, a row of transistors produced by the method described in relation with FIGS. 1A to 1N. Transistors T1, T2-T3, T4-T5, separated by insulating strips B1 and B2, have been formed around one or more lightly-doped semiconductor wires F. The wires F correspond to the wires 15A and 15B and to the protuberances 23 in FIGS. 1F to 1N. The insulating strips B1 and B2 correspond to the sacrificial gates 17 left in place in FIGS. 1I to 1N. Each transistor T1, T2, T3, T4 and T5 has a surrounding gate G1, G2, G3, G4 and G5 formed from a gate insulator I and from a gate conductor C surrounding a channel region formed by a portion of the wires F. The gate insulator I corresponds to the gate insulator layer 31 in FIGS. 1J to 1N. The gate conductor C corresponds to the conducting layer 35 in FIGS. 1K to 1N. Each transistor T1, T2, T3, T4 and T5 has a source S1, S2, S3, S4 and S5 and a drain D1, D2, D3, D4 and D5 formed by doped portions of the wires F. The doped portions of the wires F correspond to the protuberances 23 in FIGS. 1F to 1N.

The example of a row of transistors formed by the steps 1A to 1N exhibits the following features:

the transistor T1 is electrically isolated from the transistor T2 by the insulating strip B1;

the transistors T2 and T3 are connected in series;

the transistor T3 is electrically isolated from the transistor T4 by the insulating strip B2; and the transistors T4 and T5 are connected in series.

In addition, the insulating strips B1 and B2 are formed around portions of the wires F.

FIGS. 3A to 3D illustrate steps of one variant embodiment of the method for fabricating a row of surrounding gate transistors. In these Figures, the same elements as in FIGS. 1A to 1N are denoted by the same references.

Figure 3A:
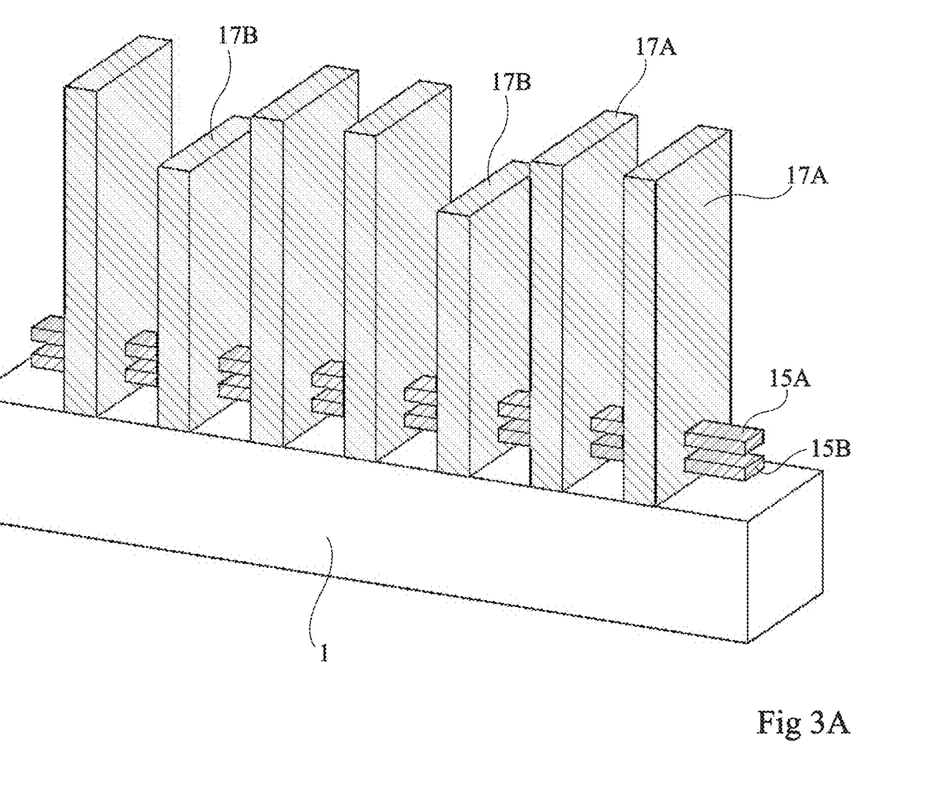
FIGS. 3A to 3D illustrate steps of one variant embodiment of the method in FIGS. 1A to 1N.

At the step in FIG. 3A, semiconductor wires 15A and 15B are formed by the steps illustrated in FIGS. 1A and 1B. Portions of the wires 15A and 15B are surrounded by sacrificial gates 17A and 17B of two different heights. The sacrificial gates 17A are larger than the sacrificial gates 17B.

In order to form various heights of sacrificial gates, layers of resist of different thicknesses may be deposited then successively irradiated. By way of a variant, the dose of irradiation could also be varied in order to vary the height of the sacrificial gates.

Figure 3B:
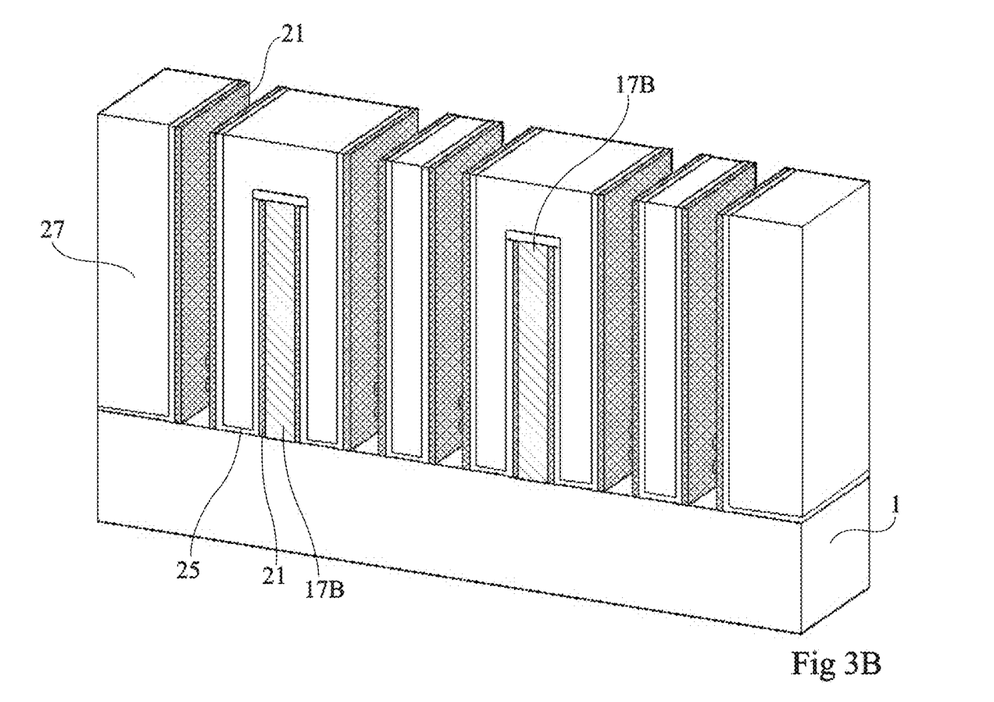

At the step in FIG. 3B, the same steps as those illustrated in FIGS. 1D to 1H have been carried out, then the visible sacrificial gates 17A are removed. The sacrificial gates 17B, smaller than the sacrificial gates 17A having their top end again covered by the etch stop layer 25 and by the temporary material 27, remain in place.

One advantage of this variant is to avoid having to form masks 29 in order to protect the sacrificial gates intended to isolate the transistors or groups of transistors. The sacrificial gates 17B are therefore intended to isolate the transistors from one another and the sacrificial gates 17A are intended to be replaced by the gates of the transistors.

Figure 3C:
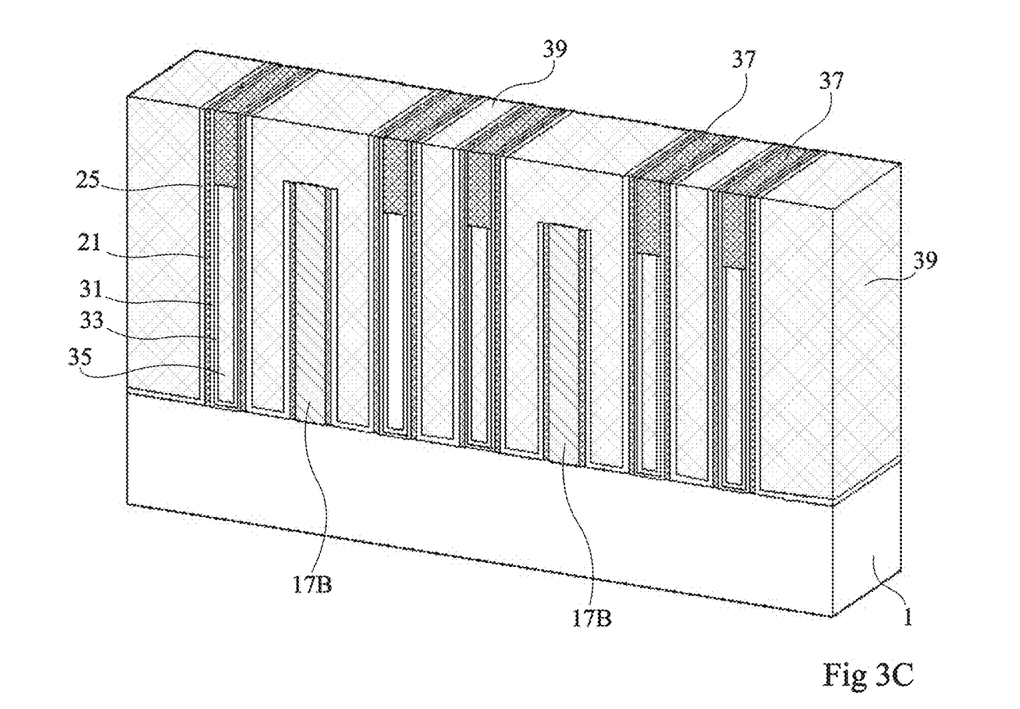

At the step in FIG. 3C, the same steps as those illustrated in FIGS. 1J to 1L have been carried out and plugs 37 have been formed. The plugs 37 have a height greater than the difference in height between the sacrificial gates 17A and the sacrificial gates 17B.

Figure 3D:
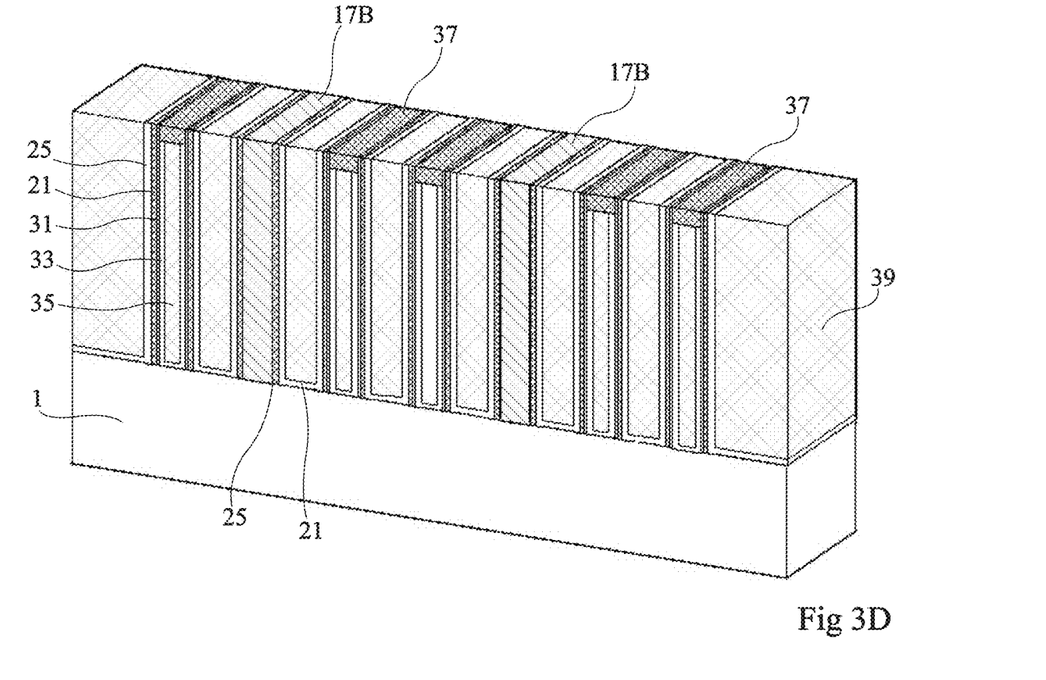

At the step in FIG. 3D, a chemical-mechanical polishing has been carried out in order to render the sacrificial gates 17B visible. As has been previously said, since the plugs 37 have a thickness greater than the difference in height between the sacrificial gates 17A and 17B, portions of plugs 37 still protect the gates of the transistors.

According to one variant previously described, other transistors could be fabricated in place of certain sacrificial gates. In this case, it could be envisaged to use a third height of sacrificial gates to isolate the transistors or groups of transistors from one another.

Figure 4A:
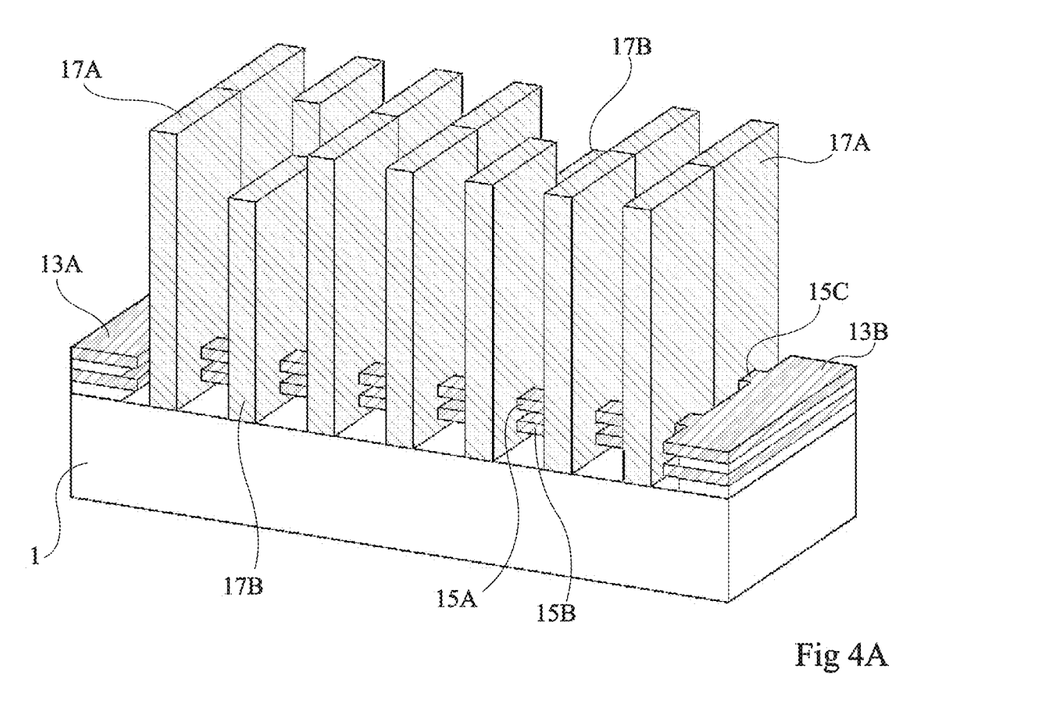
FIGS. 4A to 4C illustrate steps of another variant embodiment of the method in FIGS. 1A to 1N.
Figure 4B:
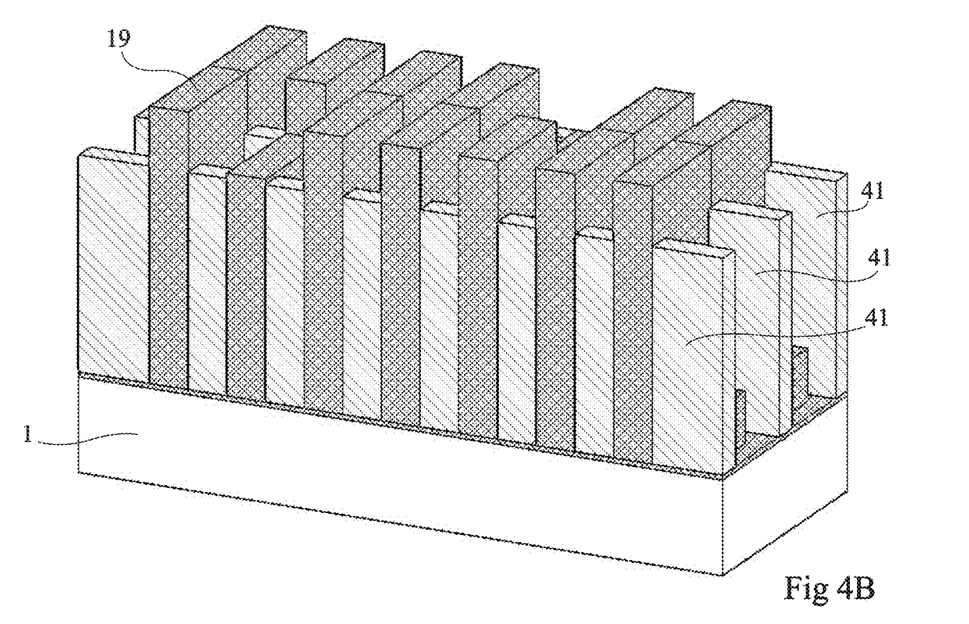
Figure 4C:
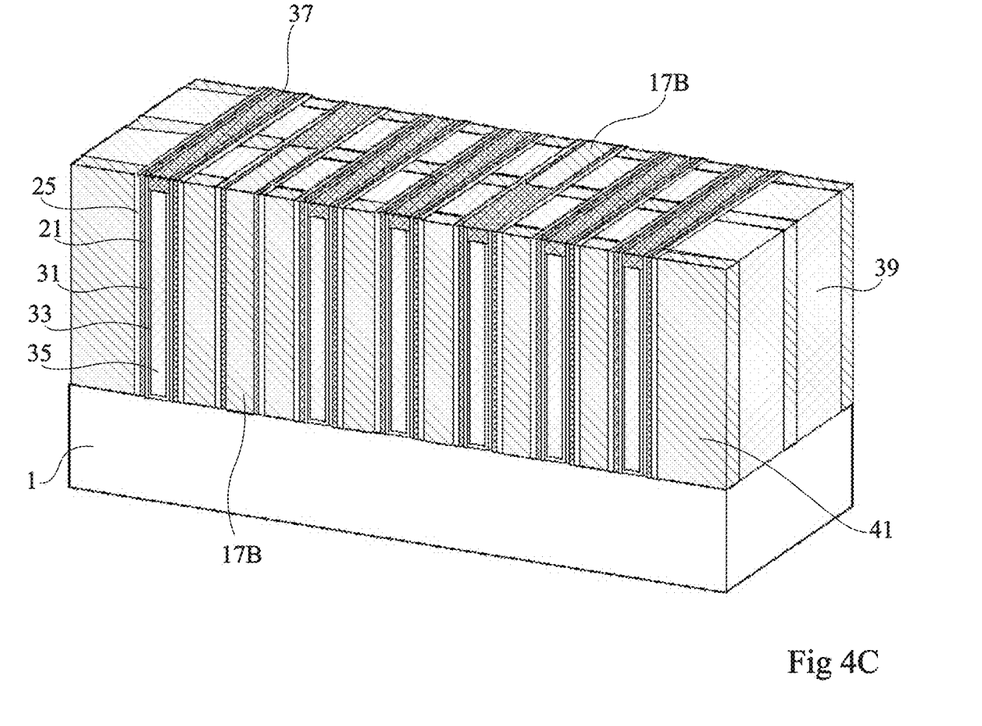

FIGS. 4A to 4C illustrate steps of one embodiment for fabricating two rows of surrounding gate MOS transistors, this embodiment being a variant embodiment of the methods for fabricating a row of surrounding gate transistors described in relation with FIGS. 1A to 1N and with FIGS. 3A to 3D. In these Figures, the same elements as in FIGS. 1A to 1N and FIGS. 3A to 3D will be denoted by the same references.

At the step in FIG. 4A, two adjacent pairs of superposed semiconductor wires 15A-15B and 15C-15D suspended on top of a semiconductor substrate 1 are formed by the same operations as those described in relation with FIGS. 1A and 1B. The wire 15A is suspended on top of the wire 15B and the wire 15C is suspended on top of the wire 15D, the wire 15D not being visible in FIG. 4A. The wires 15A, 15B are parallel to the wires 15C and 15D. The wires 15A, 15B, 15C and 15D are connected at each of their ends to common contact pads 13A and 13B. By way of a variant, the wires 15C and 15D could be connected to contact pads different from those of the wires 15A and 15B.

In addition, at the step in FIG. 4A, portions of the wires 15A, 15B, 15C and 15D have been surrounded by sacrificial gates 17A and 17B of two different heights, in the same way as in the operation described in relation with FIG. 3A. The sacrificial gates 17A, 17B surrounding the wires 15A and 15B are, for example, aligned with the sacrificial gates 17A, 17B surrounding the wires 15C and 15D. In the same way as previously, the smallest sacrificial gates, here the sacrificial gates 17B, will be used as isolation between the transistors.

At the step in FIG. 4B, the insulating layer 19 is deposited on the structure in FIG. 4A, as is described in relation with FIG. 1D. Furthermore, lateral insulating strips 41 are formed in order to isolate the future drain and source contacts of the transistors formed around the wires 15A and 15B and the future drain and source contacts of the transistors formed around the wires 15C and 15D. The lateral insulating strips 41 are disposed on either side of the future protuberances 23. The strips 41 are, for example, formed by the same method as that used for the formation of the sacrificial gates 17A and 17B, described in relation with FIG. 1C. The strips 41 are therefore, for example, composed of a resist of the HSQ type, then irradiated so as to become silicon oxide.

At the step in FIG. 4C, the same steps as those described in relation with FIGS. 1E to 1N or 3C to 3D have been carried out. The structure finally obtained comprises two rows of surrounding gate transistors, certain transistors being connected in series via their source and their drain and others having a common gate.

It is thus possible to form CMOS structures in a simple manner starting from a row of N-channel MOS transistors and of a row of P-channel MOS transistors side by side. This type of configuration is particularly useful for forming logic circuits such as inverter circuits.

More complex logic structures will be able to be formed by associating a larger number of rows of transistors.

Figure 5:
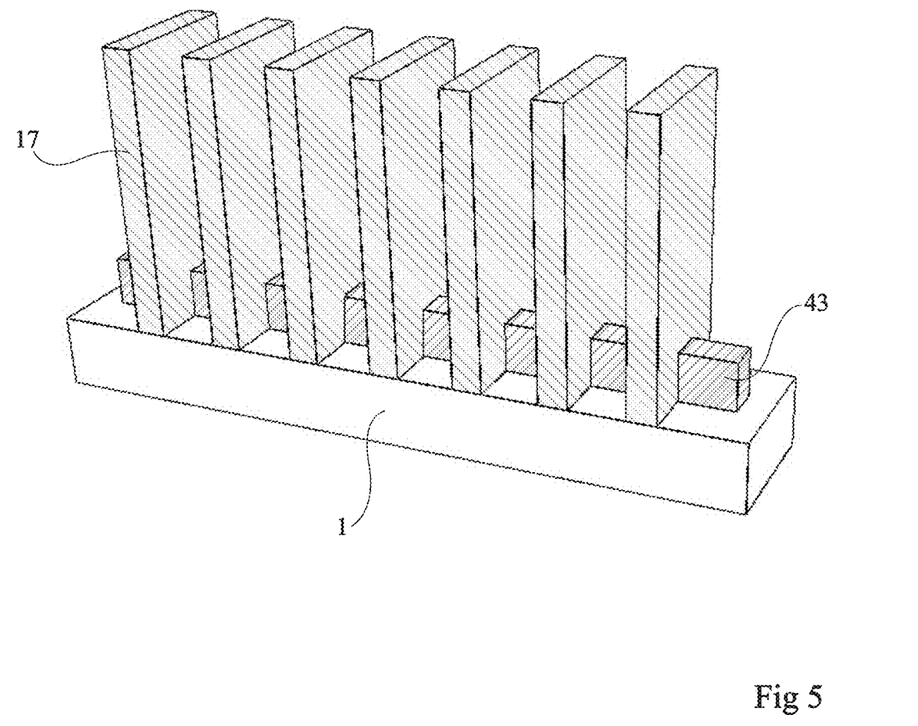
FIG. 5 illustrates a step of one embodiment of a transistor of the FinFET type.

FIG. 5 illustrates one step of an embodiment of a method for fabricating a row of field-effect transistors with a fin commonly referred to in the art as a FinFET. The steps illustrated in FIGS. 1A to 1N are adaptable to the fabrication of a transistor of the FinFET type by replacing the suspended semiconductor wires with a semiconductor fin 43.

In FIG. 5, the fin 43 is formed on a substrate 1 and sacrificial gates 17 cover portions of the fin. The sacrificial gates 17 are formed by the step described in relation with FIG. 1D.

One advantage of the fabrication methods described here is that they are compatible with the usual methods of fabricating suspended wires and fins.

Particular embodiments have been described. Many variants and modifications will become apparent to those skilled in the art. In particular, fabrication methods on a bulk substrate have been presented, but these methods may also be carried out on a layer of semiconductor-on-insulator.

In addition, the various variant embodiments of the method for fabricating a row of surrounding gate transistors are adaptable to the fabrication of a row of transistors of the FinFET type.

Moreover, it is possible to form lateral insulating strips of various heights in order to connect neighboring transistors. Various embodiments with different variants have been described hereinabove. It will be noted that those skilled in the art will be able to combine various elements of these various embodiments and variants without having to make use of any inventive step.

The invention claimed is:

1. An integrated circuit, comprising:
   a substrate;
   a strip made of a semiconductor material extending over the substrate, wherein said strip includes first portions that are spaced apart from each other to form channel regions and second portions that are doped to form source and drain regions;
   wherein each first portion is positioned between two second portions;
   wherein first ones of the first portions are covered by a gate structure comprising a gate insulator material and a metal material forming a transistor gate structure;
   wherein second ones of the first portions are covered by an insulating material defining a sacrificial gate;

wherein each sacrificial gate is positioned between two transistor gate structures.

2. The integrated circuit of claim 1, wherein the transistor gate structures and sacrificial gates have a same size.

3. The integrated circuit of claim 2, wherein the same size is a same width.

4. The integrated circuit of claim 3, wherein the transistor gate structures have a different height that the sacrificial gates.

5. The integrated circuit of claim 2, wherein the same size is a same height.

6. The integrated circuit of claim 1, wherein the first and second ones of the first portions are doped.

7. The integrated circuit of claim 1, wherein the first and second ones of the first portions are not doped.

8. The integrated circuit of claim 1, wherein the substrate is made of bulk silicon.

9. The integrated circuit of claim 1, wherein the substrate is a layer of silicon on oxide.

10. The integrated circuit of claim 1, wherein the strip is a semiconductor fin.

11. The integrated circuit of claim 1, wherein the strip is a suspended semiconductor wire over the substrate.

12. An integrated circuit, comprising:
a strip made of a semiconductor material extending on top of and parallel to a substrate, the strip including first longitudinal portions having a same first length, second longitudinal portions having a same second length, and third longitudinal portions having a same third length wherein the first and third longitudinal portions form channel regions;
sacrificial gates made of an insulating material and covering the first longitudinal portions, wherein the sacrificial gates are spaced apart from each other;
wherein the second longitudinal portions are doped to form source and drain regions, and one third longitudinal portion is located between two second longitudinal portions of a pair of second longitudinal portions, and one first longitudinal portion is located between pairs of second longitudinal portions; and
a transistor gate made of a gate insulator and a gate conductor and covering each third longitudinal portion.

13. The integrated circuit of claim 12, wherein the second length and third length are equal.

14. The integrated circuit of claim 12, wherein the first length, second length and third length are equal.

15. The integrated circuit of claim 12, wherein the second longitudinal portions include epitaxially grown material on the strip forming part of the source and drain regions.

16. The integrated circuit of claim 12, wherein the transistor gates and sacrificial gates have a same size.

17. The integrated circuit of claim 16, wherein the same size is a same width.

18. The integrated circuit of claim 17, wherein the transistor gates have a different height that the sacrificial gates.

19. The integrated circuit of claim 16, wherein the same size is a same height.

20. The integrated circuit of claim 12, wherein the substrate is made of bulk silicon.

21. The integrated circuit of claim 12, wherein the substrate is a layer of silicon on oxide.

22. The integrated circuit of claim 12, wherein the strip is a semiconductor fin.

23. The integrated circuit of claim 12, wherein the strip is a suspended semiconductor wire over the substrate.

* * * * *